United States Patent
Iwasaki (10) Patent No.: US 9,462,714 B2
(45) Date of Patent: Oct. 4, 2016

(54) HINGE UNIT CAPABLE OF PREVENTING ROTATION FROM EXCEEDING FULLY-OPEN POSITION AND ELECTRONIC APPARATUS EQUIPPED WITH HINGE UNIT

(71) Applicant: CANON KABUSHIKI KAISHA, Tokyo (JP)

(72) Inventor: Takafumi Iwasaki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/832,122

(22) Filed: Aug. 21, 2015

(65) Prior Publication Data

US 2016/0060933 A1    Mar. 3, 2016

(30) Foreign Application Priority Data

Aug. 27, 2014 (JP) ................. 2014-172544

(51) Int. Cl.
| | | |
|---|---|---|
| *H04N 5/225* | (2006.01) | |
| *H05K 5/02* | (2006.01) | |
| *H04N 5/232* | (2006.01) | |

(52) U.S. Cl.
CPC .......... *H05K 5/0226* (2013.01); *H04N 5/2251* (2013.01); *H04N 5/23293* (2013.01)

(58) Field of Classification Search
CPC .................................................... H04N 5/2251

USPC ............................................. 348/333.06, 373
See application file for complete search history.

(56) References Cited

U.S. PATENT DOCUMENTS

2008/0263824 A1* 10/2008 Sugimura ............ H04N 5/2251
                                                                    16/319

FOREIGN PATENT DOCUMENTS

JP        2005-023955 A        1/2005

* cited by examiner

*Primary Examiner* — Joel Fosselman
(74) *Attorney, Agent, or Firm* — Cowan, Liebowitz & Latman, P.C.

(57) ABSTRACT

A hinge unit which can be positively prevented from rotating in an opening direction from a fully open position, without being increased in size. The hinge unit includes a fixed member fixed to a camera body, a rotational shaft rotatably held by the fixed member, a holding member fixed to the rotational shaft in a state holding the image display section, and a clamping member having a pair of clamping portions for diametrically clamping the rotational shaft and configured to rotate in unison with the rotational shaft. In a case where the holding member rotates in the opening direction to a fully open position, one of the clamping portions is brought into abutment with the fixed member to thereby prevent the holding member from rotating in the opening direction from the fully open position.

10 Claims, 12 Drawing Sheets

HINGE UNIT CAPABLE OF PREVENTING ROTATION FROM EXCEEDING FULLY-OPEN POSITION AND ELECTRONIC APPARATUS EQUIPPED WITH HINGE UNIT

BACKGROUND OF THE INVENTION

1. Field of the Invention

The invention relates to a hinge unit that is capable of positively preventing rotation from exceeding a fully open position and an electronic apparatus equipped with the hinge unit.

2. Description of the Related Art

There has been known an electronic apparatus, such as a digital camera, which is configured to be capable of subjecting a display unit thereof to rotating operation with respect to an apparatus body via a hinge unit in an opening direction through approximately 180 degrees, thereby causing the display screen of the display unit to be positioned at a location above the apparatus body in a manner facing toward an object, such that a user can perform self-photographing in which the user photographs himself/herself.

In general, in an electronic apparatus of the above-mentioned type, when a display unit thereof is brought into a fully open state by being rotationally operated with respect to an apparatus body via a hinge unit through approximately 180 degrees, the exterior of the display unit is brought into abutment with that of the apparatus body, whereby further rotation of the display unit is restricted.

However, in the above-described rotation restriction structure, when the hinge unit has a rotational shaft having its axial center position located close to the top surface of the apparatus body in the vertical direction, it is impossible to positively restrict the rotation of the display unit even though the exterior of the apparatus body and the exterior of the display unit have respective portions for abutment. For this reason, there is a possibility that the display unit rotates through more than 180 degrees.

To avoid this, there has been proposed a technique for restricting a rotational angle between a first gear part fitted on the outer periphery of a first rotational shaft fixed to the apparatus body and a second gear part fitted on the outer periphery of a second rotational shaft to which the display unit is fixed (see Japanese Patent Laid-Open Publication No. 2005-23955). According to this proposal, each of the first gear part and the second gear part has protrusions formed such that each of the protrusions is brought into engagement with an associated recess formed in a separate member at each rotational angle. Note that the separate member is urged by an urging member, such as a coil spring, in a direction for engagement of the recess with the protrusion.

Incidentally, an electronic apparatus having a display unit supported on its apparatus body via a hinge unit in a manner rotatable in an opening/closing direction inevitably has a size larger than that of an electronic apparatus having a display unit integrally incorporated in its apparatus body. For this reason, in order to meet the recent demand for reduction of the size of an electronic apparatus, such as a digital camera, it is desirable to reduce the size of the display unit including the hinge unit.

However, the technique proposed in Japanese Patent Laid-Open Publication No. 2005-23955 requires the hinge unit including the first rotational shaft, the second rotational shaft, the first gear part, the second gear part, the separate member, and the urging member, and hence the number of components is large, resulting in an increase in the size of the hinge unit. Therefore, the size of the display unit including the hinge unit is increased, which causes an increase in the size of the whole apparatus.

SUMMARY OF THE INVENTION

The invention provides a hinge unit which can be positively prevented from rotating in an opening direction from a fully open position, without being increased in size, and an electronic apparatus equipped with the hinge unit.

In a first aspect of the invention, there is provided a hinge unit comprising a fixed member that is fixed to an apparatus body, a rotational shaft that is rotatably held by the fixed member, a holding member that is fixed to the rotational shaft in a state holding an image display section and is supported on the fixed member via the rotational shaft in a manner rotatable in an opening/closing direction, and a clamping member that has a pair of clamping portions for diametrically clamping the rotational shaft and is configured to rotate in unison with the rotational shaft, wherein in a case where the holding member rotates in the opening direction with respect to the fixed member to a fully open position, one of the clamping portions is brought into abutment with the fixed member to thereby prevent the holding member from rotating in the opening direction from the fully open position.

In a second aspect of the invention, there is provided an electronic apparatus including a display unit having an image display section, the display unit being supported on an apparatus body via a hinge unit in a manner rotatable in an opening/closing direction, wherein the hinge unit comprises a fixed member that is fixed to an apparatus body, a rotational shaft that is rotatably held by the fixed member, a holding member that is fixed to the rotational shaft in a state holding an image display section and is supported on the fixed member via the rotational shaft in a manner rotatable in an opening/closing direction, and a clamping member that has a pair of clamping portions for diametrically clamping the rotational shaft and is configured to rotate in unison with the rotational shaft, wherein in a case where the holding member rotates in the opening direction with respect to the fixed member to a fully open position, one of the clamping portions is brought into abutment with the fixed member to thereby prevent the holding member from rotating in the opening direction from the fully open position.

According to the invention, it is possible to positively prevent the hinge unit from rotating in the opening direction from the fully open position, without increasing the size of the hinge unit.

Further features of the invention will become apparent from the following description of exemplary embodiments (with reference to the attached drawings).

DESCRIPTION OF THE EMBODIMENTS

The invention will now be described in detail below with reference to the accompanying drawings showing an embodiment thereof.

Figure 1A:
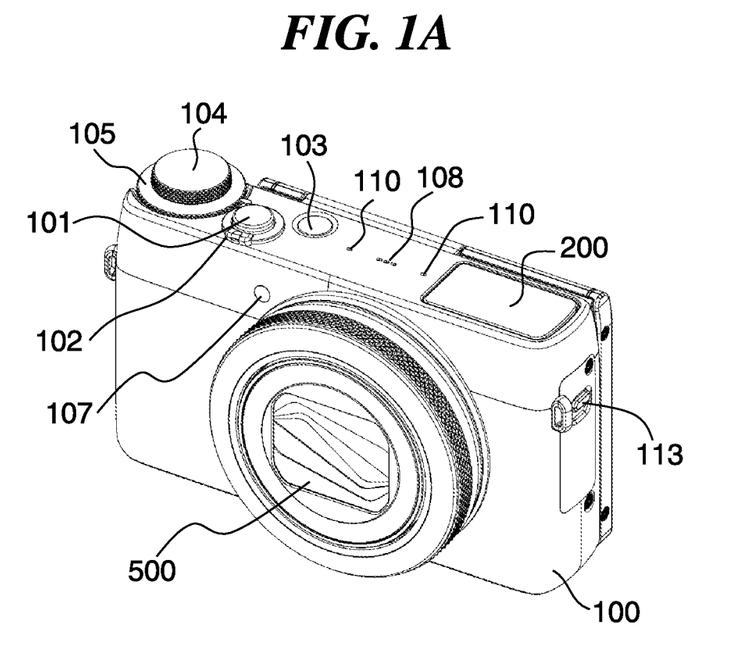
FIG. 1A is a perspective view of a digital camera as an electronic apparatus according to an embodiment of the invention, as viewed from the front thereof.
Figure 1B:
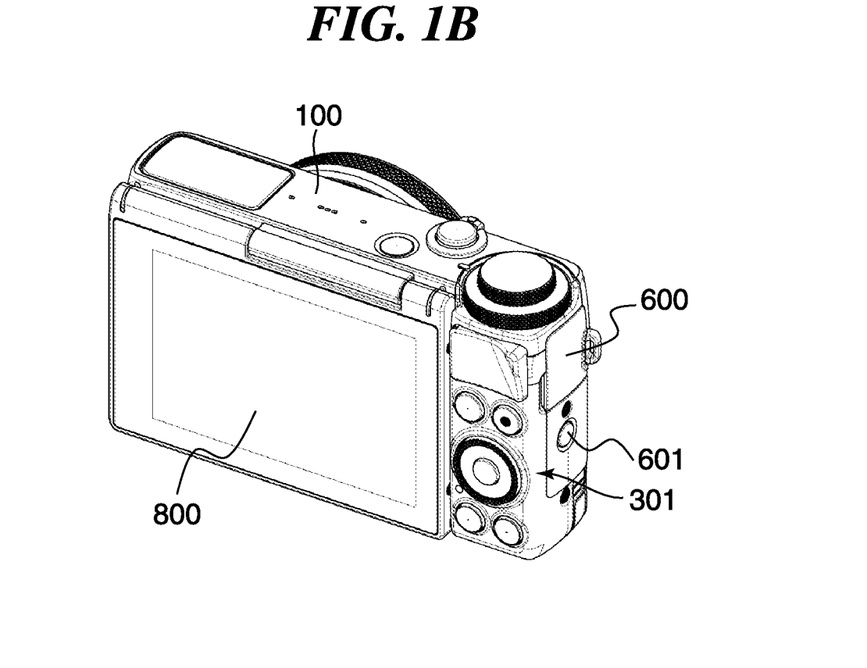
FIG. 1B is a perspective view of the digital camera shown in FIG. 1A, as viewed from the rear thereof.

FIG. 1A is a perspective view of a digital camera as an electronic apparatus equipped with a hinge unit according to the embodiment of the invention, as viewed from the front (object side) thereof, and FIG. 1B is a perspective view of the digital camera shown in FIG. 1A, as viewed from the rear thereof.

As shown in FIG. 1A, the digital camera of the present embodiment has a lens barrel 500 and an AF auxiliary light window 107 provided on the front of a camera body 100. Further, on the top of the camera body 100, there are arranged a release button 101, a zoom lever 102, a power button 103, a mode dial 104, an exposure correction dial 105, speaker holes 108, a microphone hole 110, and a pop-up strobe device 200.

Figure 2A:
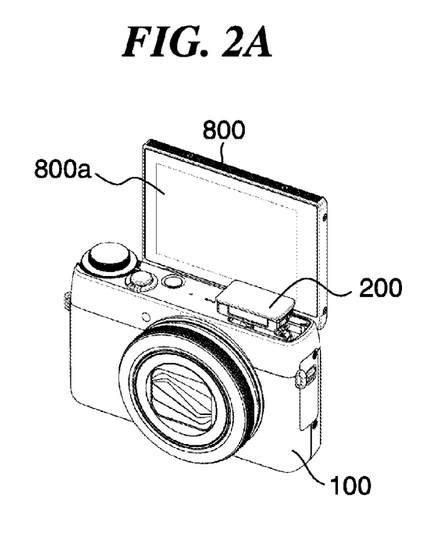
FIG. 2A is a perspective view of the digital camera with a display unit rotationally operated in the opening direction with respect to a camera body through 180 degrees, as viewed from the front thereof.

On a right side of the camera body 100, as viewed from the front thereof, there is disposed a release lever 113, and when the release lever 113 is slid downward, the strobe device 200 pops up to come into a state capable of emitting strobe light (see FIG. 2A). The camera body 100 corresponds to an apparatus body of the invention.

As shown in FIG. 1B, on the rear surface of the camera body 100, a display unit 800 formed by an LCD or the like is disposed via a hinge unit 810 (see FIG. 4), described hereinafter, in a manner rotatable in an opening/closing direction. On the right side of the display unit 800, as viewed from the rear of the camera body 100, there is disposed an operation button group 301 comprised of various operation buttons.

Further, on the right side of the camera body 100, as viewed from the rear thereof, there are disposed an operation button 601 and a connector cover 600. The connector cover 600 can be opened and closed, and when in a closed state, the connector cover 600 covers an analog video terminal, a power terminal, a digital terminal, and so forth, not shown.

Figure 2B:
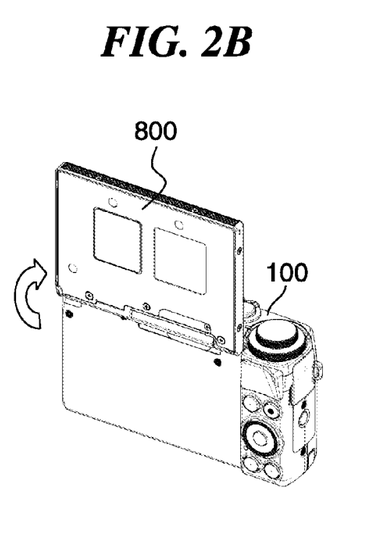
FIG. 2B is a perspective view of the digital camera in the FIG. 2A state, as viewed from the rear thereof.

FIG. 2A is a perspective view of the digital camera with the display unit 800 rotationally operated in the opening direction with respect to the camera body 100 through 180 degrees, as viewed from the front thereof, and FIG. 2B is a perspective view of the digital camera in the FIG. 2A state, as viewed from the rear thereof.

As shown in FIGS. 2A and 2B, when rotationally operated in the opening direction with respect to the camera body 100 through 180 degrees, the display unit 800 is brought into its fully open state. In the fully open state, a display screen 800a of the display unit 800 is oriented toward an object at a location above the camera body 100, whereby self-photographing is enabled.

Figure 3:
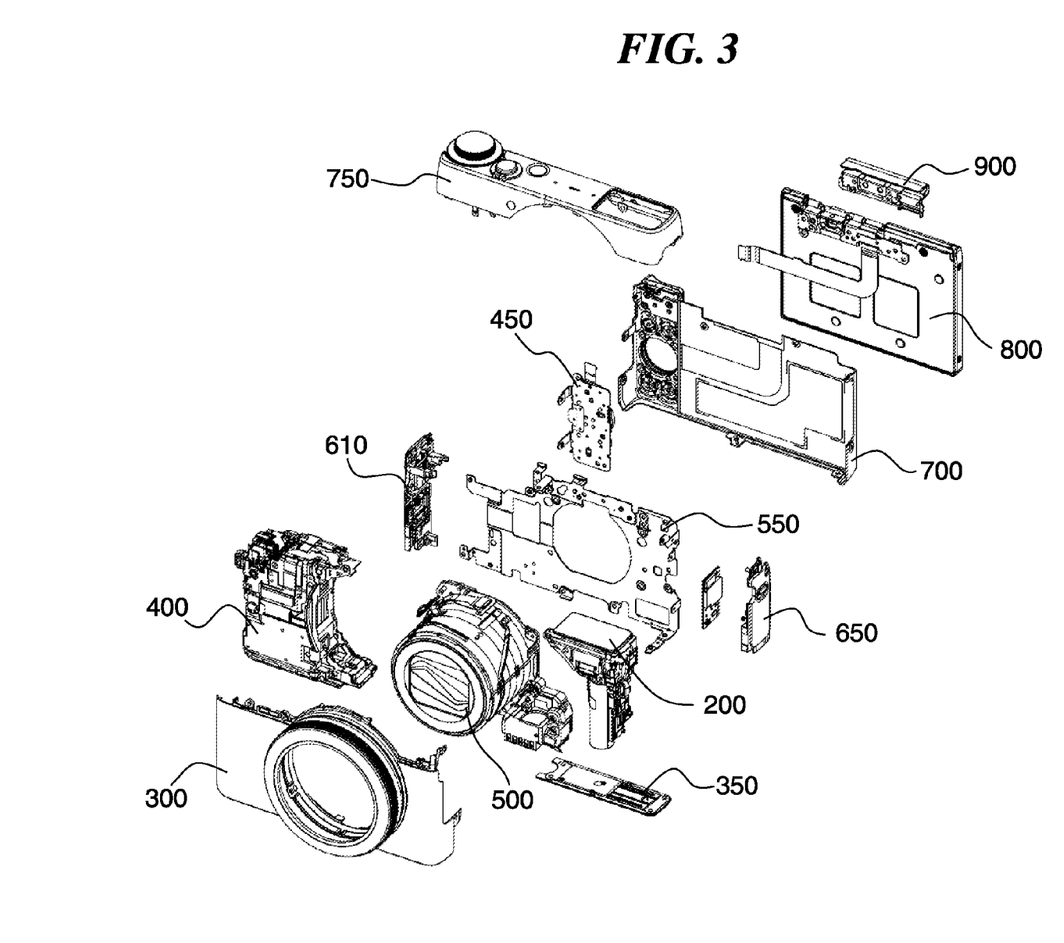
FIG. 3 is an exploded perspective view of the digital camera shown in FIG. 1A.

FIG. 3 is an exploded perspective view of the digital camera shown in FIG. 1A. As shown in FIG. 3, the camera body 100 of the digital camera of the present embodiment has an exterior formed by a top cover unit 750, a front cover unit 300, a left side cover 610, a right side cover 650, a rear cover unit 700, and a bottom cover 350.

The rear cover unit 700 holds a circuit board 450 for the operation button group 301 and others, and the lens barrel 500 is held by a metal chassis 550. On left and right sides of the lens barrel 500, there are disposed a battery box unit 400 and the strobe device 200, respectively. A part of the display unit 800 is covered and protected by a protection cover 900.

Figure 4:
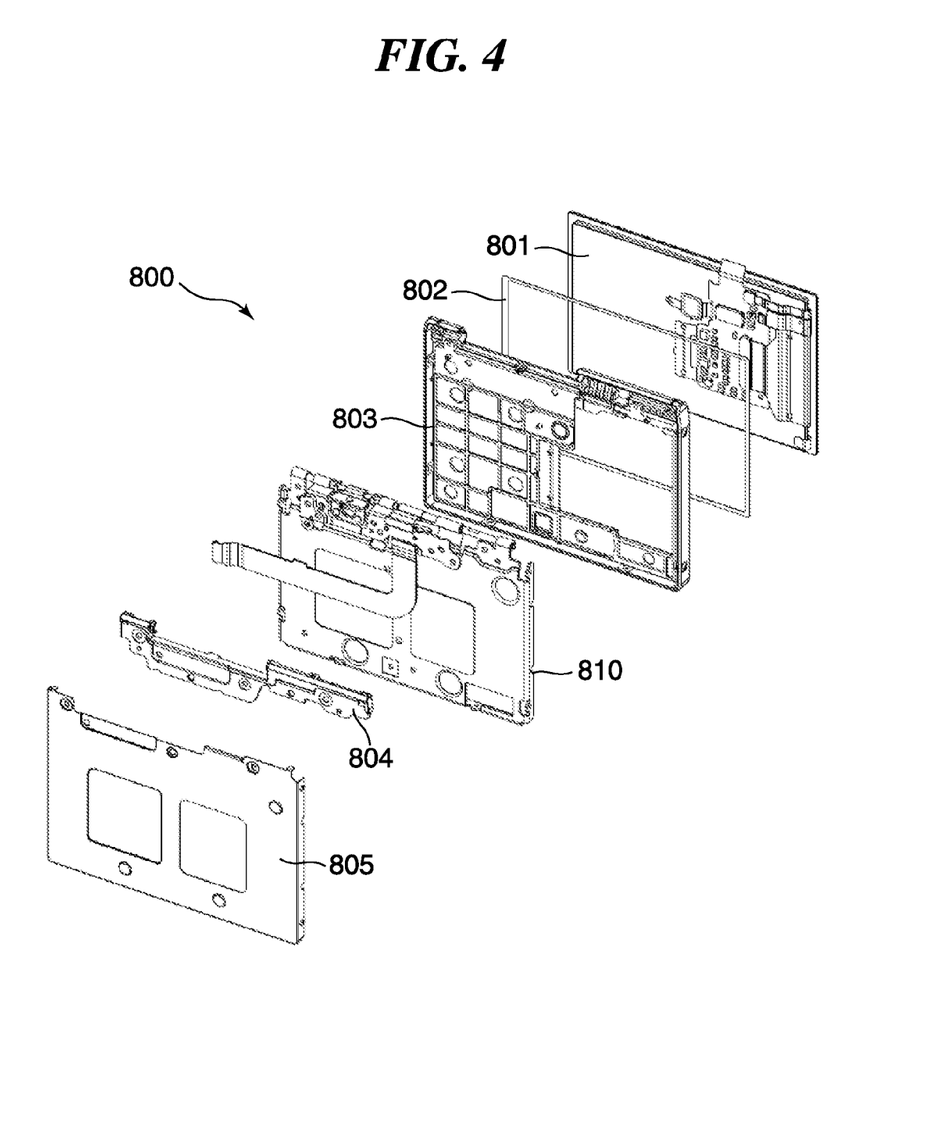
FIG. 4 is an exploded perspective view of the display unit, as viewed from the front of the camera body.

FIG. 4 is an exploded perspective view of the display unit 800 as viewed from the front of the camera body 100. As shown in FIG. 4, the display unit 800 has exterior covers 804 and 805, the hinge unit 810, an exterior cover 803, and an image display section 801 arranged in the mentioned order from a front side to a rear side, as viewed in FIG. 4.

The image display section 801 is fixedly held by the exterior cover 803 e.g. via a double-sided tape 802. The hinge unit 810 is fixed to the camera body 100 in a state holding the image display section 801 and the exterior cover 803. The exterior covers 804 and 805 cover the front, as viewed in FIG. 4, of the hinge unit 810.

Figure 5A:
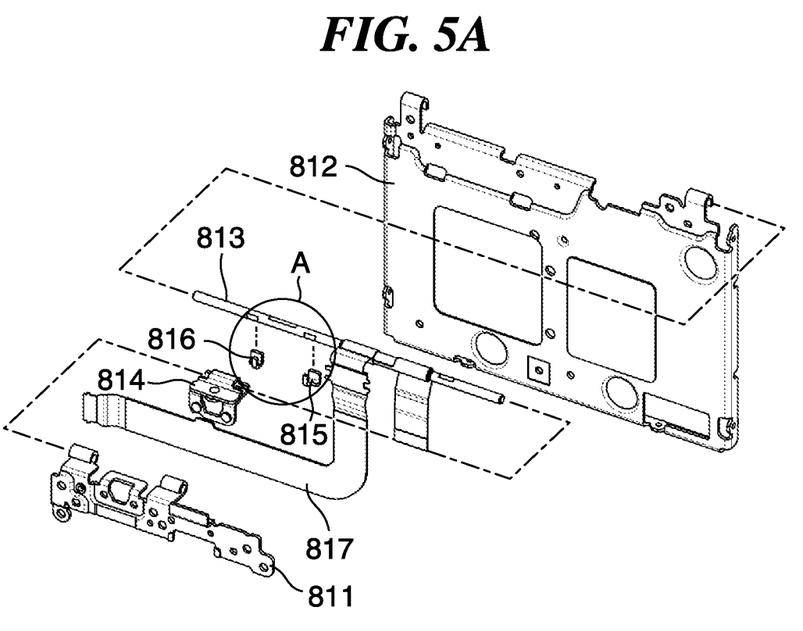
FIG. 5A is an exploded perspective view of a hinge unit, as viewed from the front of the camera body.
Figure 5B:
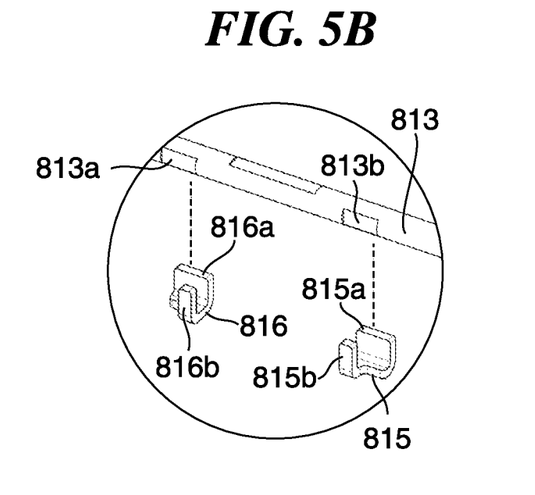
FIG. 5B is an enlarged view of an A portion in FIG. 5A.
Figure 6A:
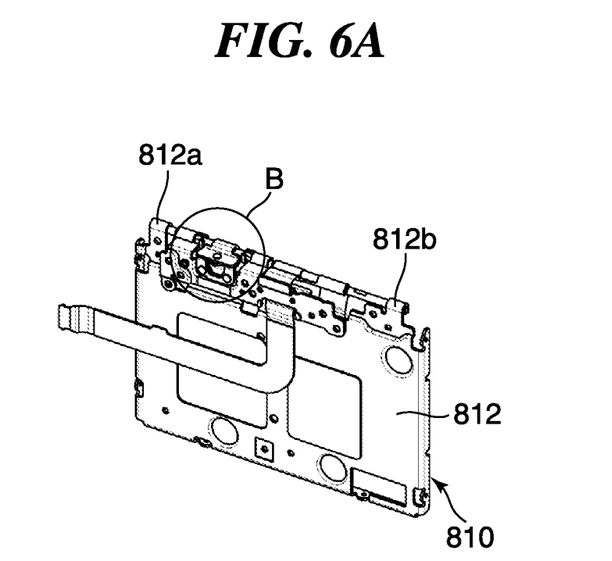
FIG. 6A is a perspective view of an assembly of the hinge unit shown in FIG. 5A.

Next, the hinge unit 810 will be described in detail with reference to FIGS. 5A and 5B and FIGS. 6A and 6B. FIG. 5A is an exploded perspective view of the hinge unit 810, as viewed from the front of the camera body 100, and FIG. 5B is an enlarged view of an A portion in FIG. 5A. FIG. 6A is a perspective view of an assembly of the hinge unit 810 shown in FIG. 5A, and FIG. 6B is an enlarged view of a B portion in FIG. 6A.

As shown in FIGS. 5A and 5B, the hinge unit 810 is comprised of a holding member 812 for holding the image display section 801 and the exterior cover 803, a rotational shaft 813 to which to the holding member 812 is fixed, and a fixed member 811 fixed to the camera body 100 in a state rotatably holding the rotational shaft 813. A friction member 814 is fixed to the fixed member 811, for applying moderate frictional resistance to the rotational shaft 813 during rotation of the same.

Figure 6B:
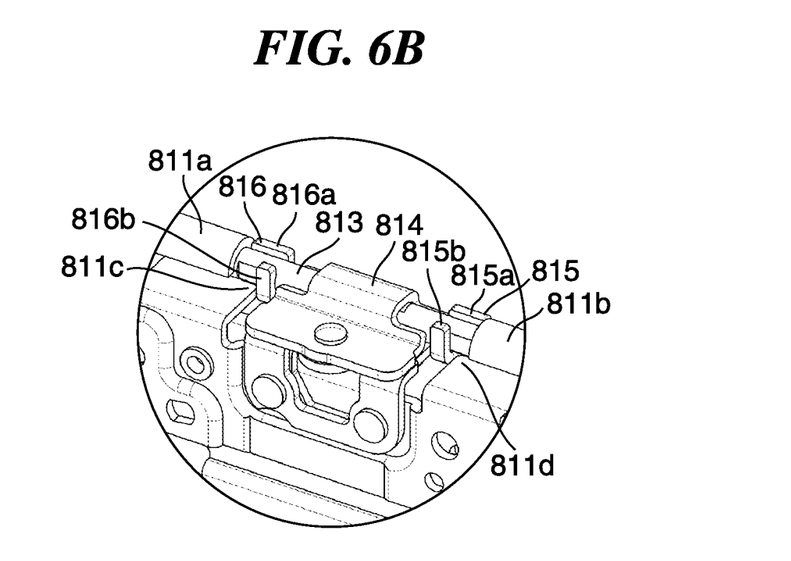
FIG. 6B is an enlarged view of a B portion in FIG. 6A.

As shown in FIG. 6B, the fixed member 811 is formed with hollow cylindrical holding portions 811a and 811b for rotatably holding the rotational shaft 813. Further, as shown in FIG. 6A, the holding member 812 is formed with U-shaped holding portions 812a and 812b for holding the rotational shaft 813. The rotational shaft 813 and the holding portions 812a and 812b are integrally fixed to each other e.g. by welding.

The hinge unit 810 also has clamping members 815 and 816 which are fixed to the rotational shaft 813 in a state diametrically clamping the same for rotation in unison therewith. The clamping members 815 and 816 are integrally fixed e.g. by welding to flat portions 813b and 813a formed on the outer periphery of the rotational shaft 813, in a state clamping the flat portions 813b and 813a, whereby the clamping members 815 and 816 and the rotational shaft 813 are integrally combined. The flat portions 813b and 813a are formed in pairs, respectively, on the rotational shaft 813, such that each pair of flat portions are diametrically opposed to each other. Further, the hinge unit 810 is provided with a flexible printed circuit board 817 for electrically connecting the image display section 801 and a circuit board, not shown, of the camera body 100.

In the present embodiment, as the holding member 812 of the hinge unit 810 rotates, the rotational shaft 813 and the clamping members 815 and 816 also rotate in accordance with the rotation of the holding member 812. On the other hand, the fixed member 811 and the friction member 814 do not rotate even when the holding member 812 rotates.

As shown in FIG. 5B, each of the clamping members 815 and 816 is formed into a substantially U shape. The clamping members 815 and 816 are each fitted to the rotational shaft 813 from below, as viewed in FIG. 5B, and fixed to the rotational shaft 813 e.g. by welding in a state clamping the flat portions 813b and 813a, as described hereinbefore.

The clamping member 815 has a pair of clamping portions 815a and 815b for clamping the flat portions 813b, and one clamping portion 815a has a width larger in the axial direction of the rotational shaft 813 than that of the other clamping portion 815b. Similarly, the clamping member 816 has a pair of clamping portions 816a and 816b for clamping the flat portions 813a, and one clamping portion 816a has a width larger in the axial direction of the rotational shaft 813 than that of the other clamping portion 816b. As shown in FIG. 6B, the clamping members 815 and 816 are disposed adjacent to the fixed member 811.

Figure 7A:
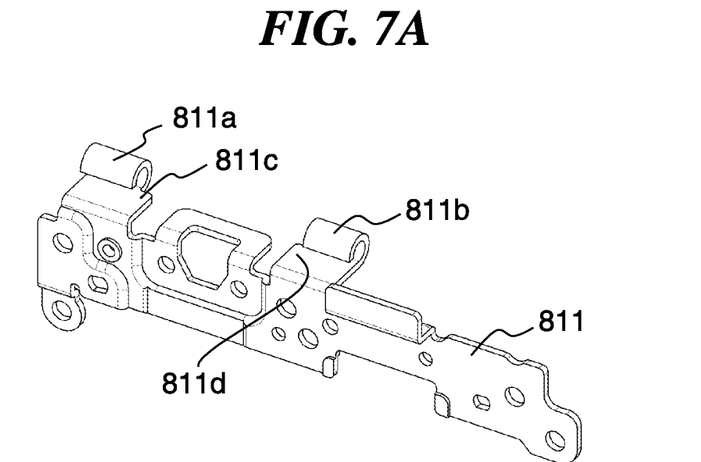
FIG. 7A is a perspective view of a fixing member, as viewed from the front thereof.
Figure 7B:
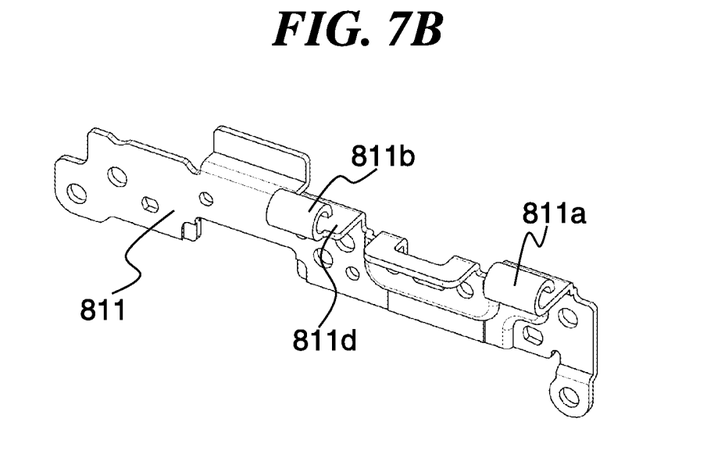
FIG. 7B is a perspective view of the fixing member in FIG. 7A, as viewed from the rear thereof.

FIG. 7A is a perspective view of the fixed member 811, as viewed from the front thereof, and FIG. 7B is a perspective view of the fixed member 811 in FIG. 7A, as viewed from the rear thereof. As described hereinbefore, the hollow cylindrical holding portions 811a and 811b rotatably hold the rotational shaft 813. The fixed member 811 has a flat portion 811c formed on a side of the holding portion 811a facing toward the holding portion 811b in the axial direction of the rotational shaft 813 and a flat portion 811d formed on a side of the holding portion 811b facing toward the holding portion 811a.

Figure 8:
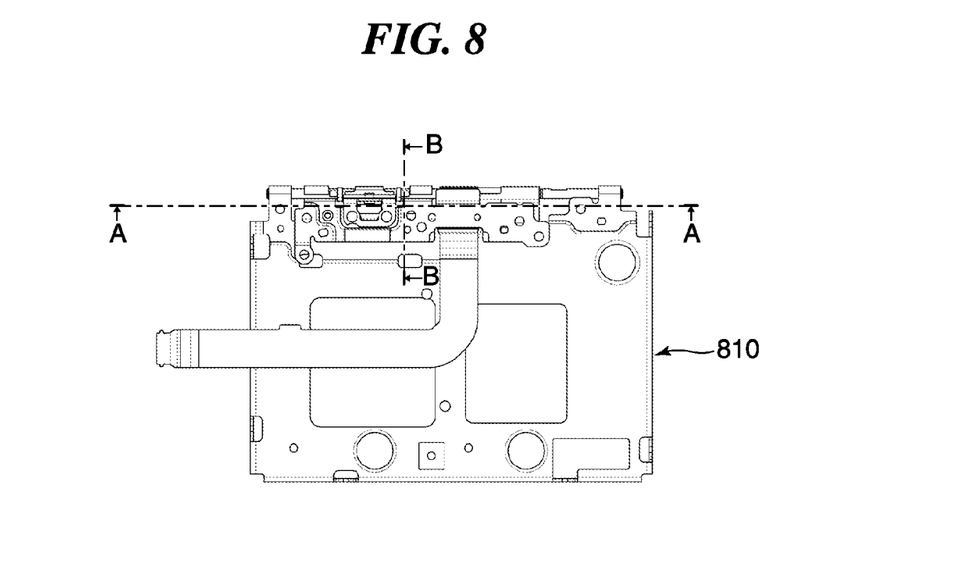
FIG. 8 is a front view of the hinge unit.
Figure 9:
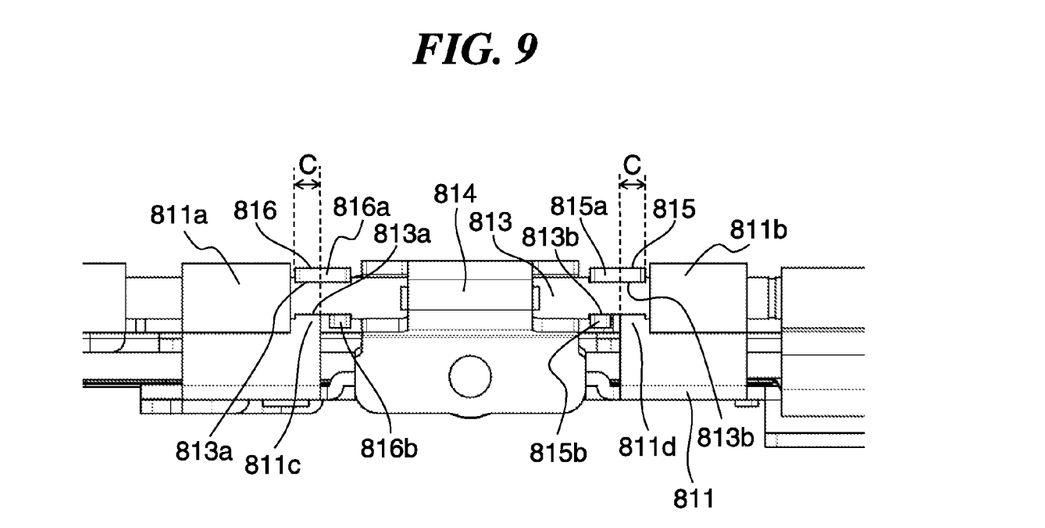
FIG. 9 is a top view of the hinge unit shown in FIG. 8.
Figure 10:
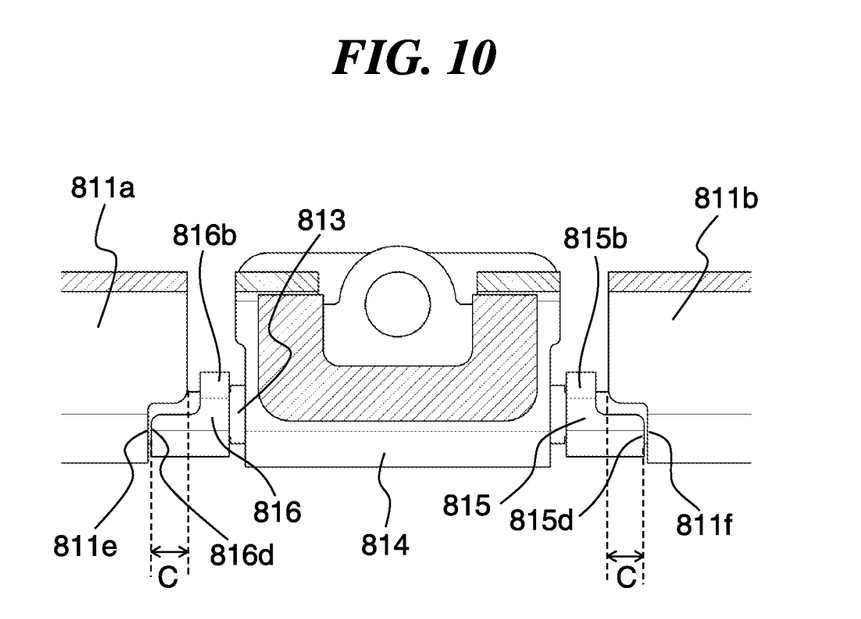
FIG. 10 is a cross-sectional view taken on line A--A of FIG. 8.

FIG. 8 is a front view of the hinge unit 810. FIG. 9 is a top view of the hinge unit 810 shown in FIG. 8. FIG. 10 is a cross-sectional view taken on line A--A of FIG. 8.

FIGS. 9 and 10 show a state where the holding member 812 is held closed with respect to the fixed member 811. In this state, each of the wide clamping portions 815a and 816a of the respective clamping members 815 and 816 is positioned in a manner overlapping the associated one of the flat portions 811c and 811d of the fixed member 811 by a distance C in the axial direction of the rotational shaft 813.

Therefore, when the holding member 812 is rotationally operated from the state shown in FIGS. 9 and 10 through 180 degrees in the opening direction, each of the wide clamping portions 815a and 816a of the respective clamping members 815 and 816 comes into abutment with the associated one of the flat portions 811c and 811d of the fixed member 811 only by a portion corresponding to the distance C, whereby further rotation of the holding member 812 is restricted. The clamping members 815 and 816 are fixed to the rotational shaft 813 e.g. by welding, in a state diametrically clamping the rotational shaft 813 with the wide clamping portions 815a and 816a and the narrow clamping portions 815b and 816b thereof.

The fixed member 811 is configured to be movable in the axial direction of the rotational shaft 813 in a state rotatably holding the rotational shaft 813 with the holding portions 811a and 811b. To this end, in the present embodiment, in the axial direction of the rotational shaft 813, gaps are formed, respectively, between ends 815d and 816d of the respective clamping members 815 and 816 and ends 811f and 811e of the fixed member 811, as shown in FIG. 10. Thus, the clamping members 815 and 816 also serve to restrict the motion of the fixed member 811 in the axial direction of the rotational shaft 813.

Figure 11A:
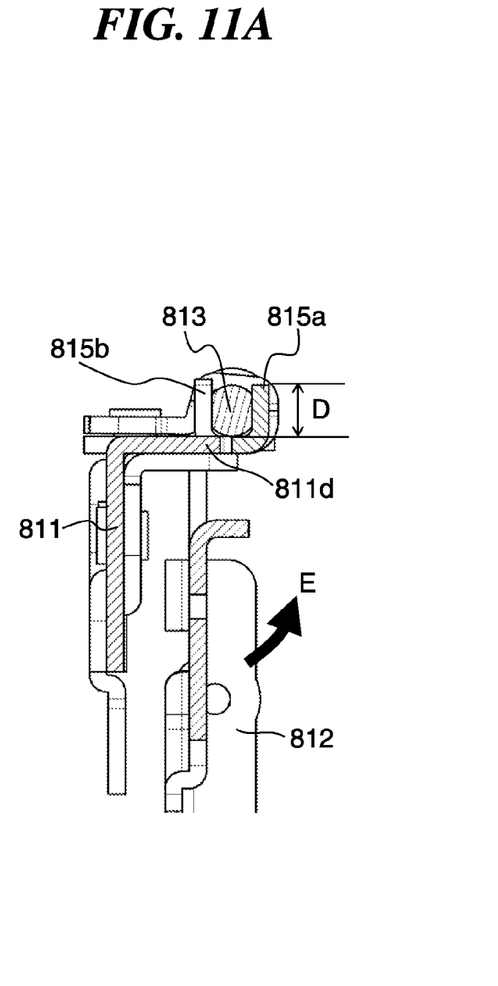
FIG. 11A is a cross-sectional view taken on line B--B of FIG. 8.
Figure 11B:
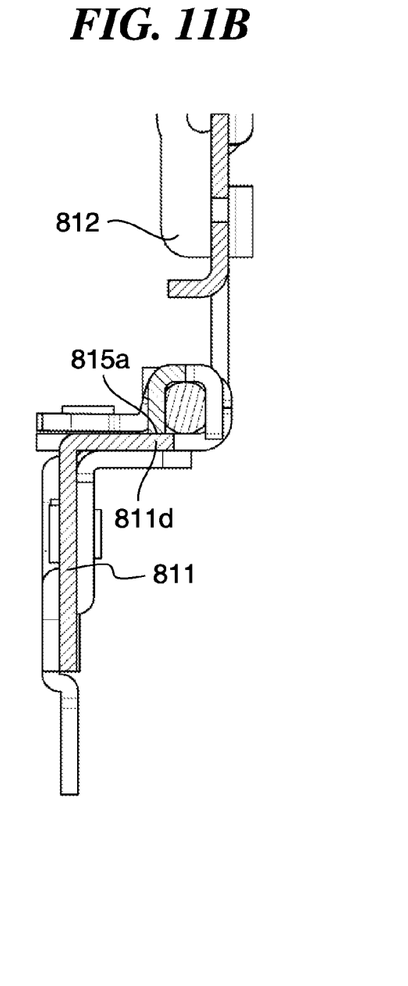
FIG. 11B is a cross-sectional view of the hinge unit with a holding member rotationally operated through approximately 180 degrees from the FIG. 11A state.

FIG. 11A is a cross-sectional view taken on line B--B of FIG. 8, and FIG. 11B is a cross-sectional view of the hinge unit 810 with the holding member 812 rotationally operated in a direction of an arrow E direction from the FIG. 11A state through approximately 180 degrees.

When the holding member 812 is rotationally operated through approximately 180 degrees with respect to the fixed member 811 as shown in FIG. 11B, the flat portion 811d of the fixed member 811 and the wide clamping portion 815a (end face thereof) of the clamping member 815 are brought into abutment with each other, whereby further rotation of the holding member 812 is restricted, as described hereinbefore. A clamping length D of the wide clamping portion 815a of the clamping member 815 in the diametrical direction of the rotational shaft 813 is set to the same length as that of the shaft diameter of the rotational shaft 813.

Therefore, when the end face of the wide clamping portion 815a is brought into abutment with the flat portion 811d by rotation of the rotational shaft 813, it is possible to achieve surface contact therebetween, and thereby positively prevent the holding member 812 from rotating through more than 180 degrees. Note that the above applies to the clamping member 816 though only the clamping member 815 is shown in FIGS. 11A and 11B.

Further, in the present embodiment, the plurality of clamping members 815 and 816 are disposed, so that when an attempt is made to rotate the holding member 812 through more than 180 degrees, it is possible to disperse stress on the contact portion between the flat portions 811c and 811d and the wide clamping portions 816a and 815a. This makes it possible to sufficiently withstand a large static pressure.

Figure 12A:
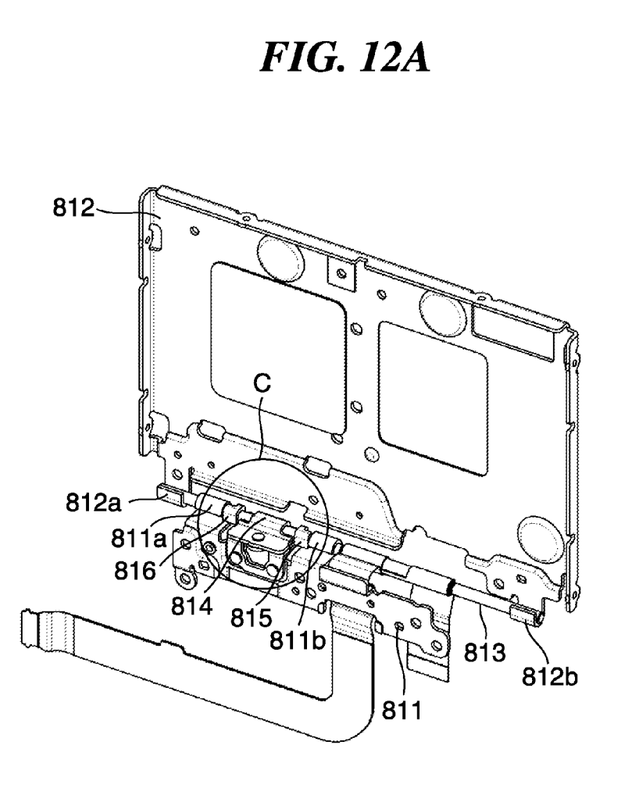
FIG. 12A is a perspective view of the hinge unit with the holding member rotationally operated through approximately 180 degrees, as viewed from the front of the camera body.
Figure 12B:
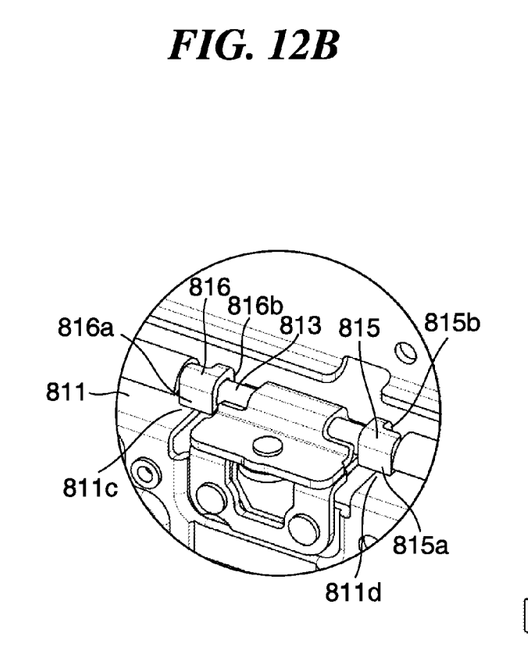
FIG. 12B is an enlarged view of a C portion in FIG. 12A.

FIG. 12A is a perspective view of the hinge unit 810 with the holding member 812 rotationally operated through 180 degrees, as viewed from the front of the camera body 100, and FIG. 12B is an enlarged view of a C portion in FIG. 12A. As shown in FIG. 12B, when the holding member 812 is rotationally operated through 180 degrees, the end faces of the wide clamping portions 815a and 816a of the clamping members 815 and 816 are held in abutment with the flat portions 811c and 811d of the fixed member 811, whereby further rotation of the holding member 812 is restricted.

Figure 13A:
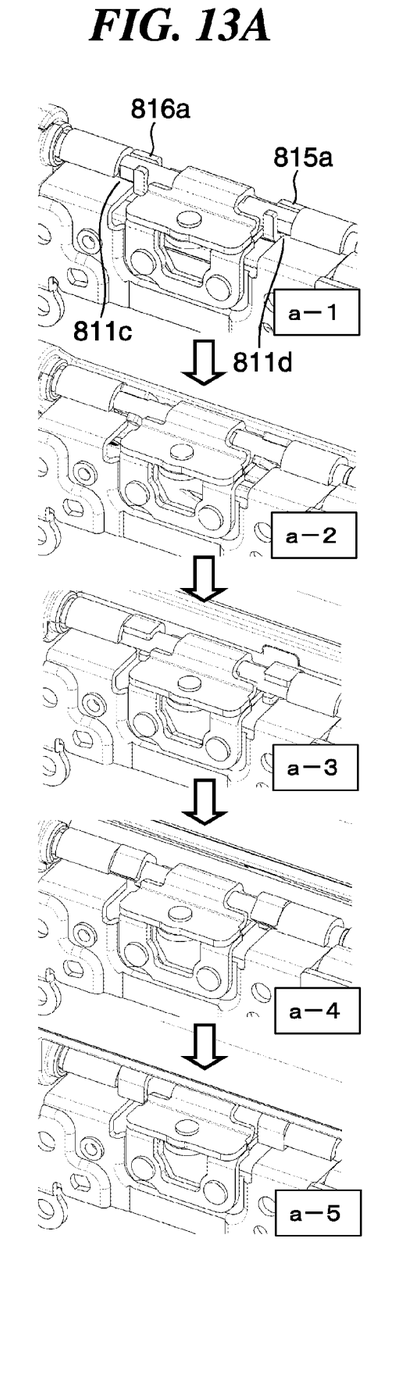
FIG. 13A is a series of perspective views of essential parts of the hinge unit, which is useful in explaining how clamping members of the hinge unit operate as the display unit is rotationally operated in an opening direction with respect to the camera body from its closed state through approximately 180 degrees.
Figure 13B:
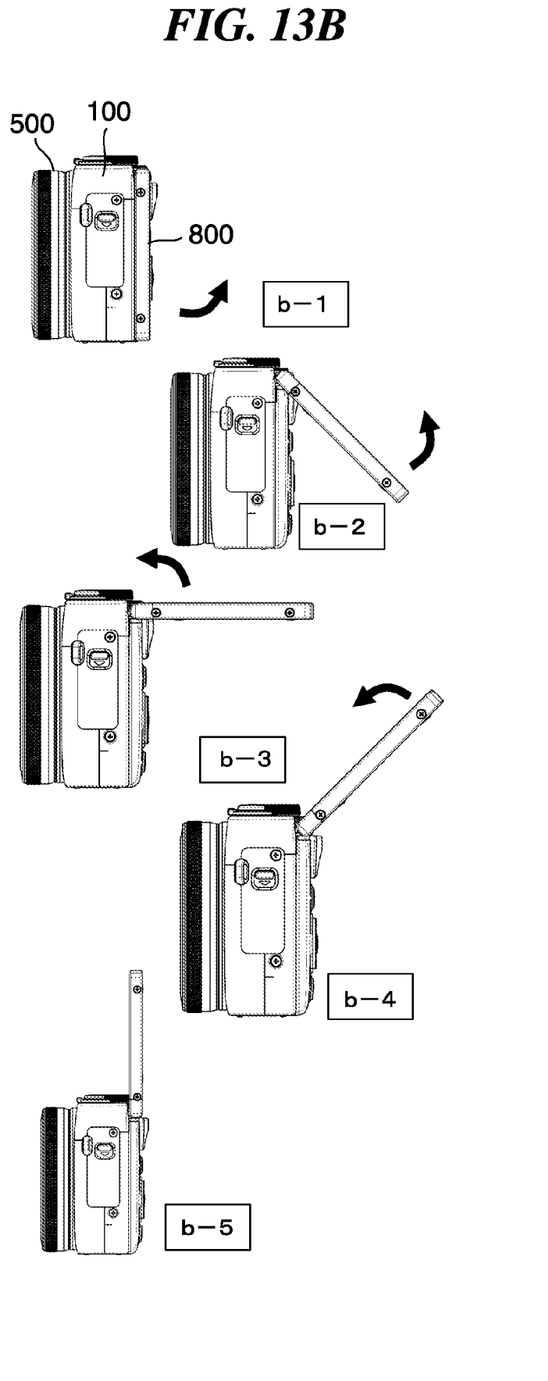
FIG. 13B is a series of side views of the hinge unit, which is useful in explaining how the hinge unit operates as the display unit is rotationally operated in the opening direction with respect to the camera body from its closed state through approximately 180 degrees.

FIG. 13A is a series of perspective views of essential parts of the hinge unit 810, which is useful in explaining how the clamping members 815 and 816 of the hinge unit 810 operate as the display unit 800 is rotationally operated in the opening direction with respect to the camera body 100 from its closed state through approximately 180 degrees. FIG. 13B is a series of side views of the hinge unit 810, which is useful in explaining how the hinge unit 810 operates as the display unit 800 is rotationally operated in the opening direction from its closed state through approximately 180 degrees.

In a state shown in a-1 of FIG. 13A and b-1 of FIG. 13B, the display unit 800 is in a closed state. Then, when the display unit 800 is rotationally operated from the state in a-1 of FIG. 13A (b-1 of FIG. 13B) via states shown in a-2 to a-4 of FIG. 13A (b-2 to b-4 of FIG. 13B) through 180 degrees, the hinge unit 810 is brought into a state shown in a-5 of FIG. 13A (b-5 of FIG. 13B). At this time, the end faces of the wide clamping portions 815a and 816a of the clamping members 815 and 816 are brought into abutment with the flat portions 811c and 811d of the fixed member 811, whereby further rotation of the holding member 812 is restricted.

As described heretofore, according to the present embodiment, in the fully open state of the display unit 800, the wide clamping portions 815a and 816a of the respective clamping members 815 and 816 are held in contact with the respective flat portions 811c and 811d of the fixed member 811 fixed to the camera body 100. This makes it possible to positively prevent the display unit 800 from rotating in the opening direction from its fully open position.

Further, the hinge unit 810 of the present embodiment makes it possible reduce the number of components compared with the conventional hinge unit that needs the first and second rotational shafts, the first and second gear sections, the separate member, the urging member, and so forth, so that the size reduction of the hinge unit 810 can be achieved, which contributes to reduction of the size of the display unit 800 and that of the whole camera.

As a consequence, the present embodiment makes it possible to positively prevent the display unit 800 from rotating from its fully open position in the opening direction, while achieving the size reduction of the camera having the display unit 800 supported on the camera body 100 via the hinge unit 810 in a manner rotatable in the opening/closing direction.

While the invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-172544 filed Aug. 27, 2014 which is hereby incorporated by reference herein in its entirety.

What is claimed is:

1. A hinge unit comprising:
   a fixed member that is fixed to an apparatus body;
   a rotational shaft that is rotatably held by said fixed member;
   a holding member that is fixed to said rotational shaft in a state holding an image display section and is supported on said fixed member via said rotational shaft in a manner rotatable in an opening/closing direction; and
   a clamping member that has a pair of clamping portions for diametrically clamping said rotational shaft and is configured to rotate in unison with said rotational shaft,
   wherein in a case where said holding member rotates in the opening direction with respect to said fixed member to a fully open position, one of the clamping portions is brought into abutment with said fixed member to thereby prevent said holding member from rotating in the opening direction from the fully open position.

2. The hinge unit according to claim 1, wherein a clamping length of the one of the clamping portions which is brought into abutment with said fixed member in a diametrical direction of said rotational shaft is equal to a shaft diameter of said rotational shaft.

3. The hinge unit according to claim 1, wherein said fixed member has a flat portion formed thereon for abutment with an end face of the one of the clamping portions.

4. The hinge unit according to claim 1, wherein said clamping member is provided in plurality in an axial direction of said rotational shaft.

5. The hinge unit according to claim 1, wherein said clamping member is brought into abutment with said fixed member in the axial direction of said rotational shaft to thereby restrict motion of said fixed member in the axial direction of said rotational shaft.

6. An electronic apparatus including a display unit having an image display section, the display unit being supported on an apparatus body via a hinge unit in a manner rotatable in an opening/closing direction,
   wherein said hinge unit comprises:
   a fixed member that is fixed to an apparatus body;
   a rotational shaft that is rotatably held by said fixed member;
   a holding member that is fixed to said rotational shaft in a state holding an image display section and is supported on said fixed member via said rotational shaft in a manner rotatable in an opening/closing direction; and
   a clamping member that has a pair of clamping portions for diametrically clamping said rotational shaft and is configured to rotate in unison with said rotational shaft,
   wherein in a case where said holding member rotates in the opening direction with respect to said fixed member to a fully open position, one of the clamping portions is brought into abutment with said fixed member to thereby prevent said holding member from rotating in the opening direction from the fully open position.

7. The electronic apparatus according to claim 6, wherein a clamping length of the one of the clamping portions which is brought into abutment with said fixed member in a diametrical direction of said rotational shaft is equal to a shaft diameter of said rotational shaft.

8. The electronic apparatus according to claim 6, wherein said fixed member has a flat portion formed thereon for abutment with an end face of the one of the clamping portions.

9. The electronic apparatus according to claim 6, wherein said clamping member is provided in plurality in an axial direction of said rotational shaft.

10. The electronic apparatus according to claim 6, wherein said clamping member is brought into abutment with said fixed member in the axial direction of said rotational shaft to thereby restrict motion of said fixed member in the axial direction of said rotational shaft.

* * * * *